United States Patent [19]

Yu et al.

[11] Patent Number: 5,757,193
[45] Date of Patent: May 26, 1998

[54] APPARATUS FOR DETECTING DEFECTS OF WIRING BOARD

[75] Inventors: Nu Yu, Kawagoe; Tsunetoshi Sugiyama, Higashimatsuyama; Shizuo Ogura, Tsurugashima; Yusuke Takano, Tokyo, all of Japan

[73] Assignee: Hoechst Aktiengesellschaft, Frankfurt, Germany

[21] Appl. No.: 639,835

[22] Filed: Apr. 26, 1996

[30] Foreign Application Priority Data

Apr. 28, 1995 [JP] Japan .................... 7-106127
Dec. 4, 1995 [JP] Japan .................... 7-315316

[51] Int. Cl.$^6$ .................... G01N 21/17; G01R 31/02
[52] U.S. Cl. .................... 324/501; 324/753; 250/559.45
[58] Field of Search .................... 324/501, 512, 324/537, 753; 250/559.07, 559.34, 559.42, 559.43, 559.45; 356/237

[56] References Cited

U.S. PATENT DOCUMENTS

| | | | |
|---|---|---|---|
| 4,812,037 | 3/1989 | Riedel et al. .................... | 324/501 X |
| 5,270,655 | 12/1993 | Tomita .................... | 324/501 |
| 5,311,137 | 5/1994 | Chang et al. .................... | 324/501 |
| 5,394,098 | 2/1995 | Meyrueix et al. .................... | 324/750 |
| 5,406,213 | 4/1995 | Henley .................... | 324/753 |
| 5,598,100 | 1/1997 | Maeda et al. .................... | 324/501 |

FOREIGN PATENT DOCUMENTS

| | | |
|---|---|---|
| 0264482 | 4/1988 | European Pat. Off. . |
| 0405737 | 1/1991 | European Pat. Off. . |

OTHER PUBLICATIONS

Kern et al., "Fluorescent Tracers–Powerful Tools for Studying Corrosion Phenomenom and Defects in Dielectrics", vol. 43, No. 2, 1982, pp. 310–338, XP002048671.

*Primary Examiner*—Glenn W. Brown
*Attorney, Agent, or Firm*—Frommer Lawrence & Haug LLP

[57] ABSTRACT

A low-cost, fast and highly accurate defective wire detector is provided for detecting defects of wires in a wiring board at least having one wiring layer. The detector has a light emitting element substrate comprising a transparent substrate and a light emitting element arranged thereon. The light emitting element is, for example, an organic light emitting element or an organic light emitting diode. The light emitting element substrate is placed to be in contact with wires on a wiring board under measurement. The detector detects and processes a condition of light emitted from the light emitting element substrate when a voltage is applied between the light emitting element substrate and the wiring board, and determines whether or not any defective wire is present.

13 Claims, 7 Drawing Sheets ptitch ranging from 0.5 to 0.15 mm. However, since the operator is required to move and contact pins at many points on a printed wiring board under test, a test conducted by the flying type testing apparatus takes a longer time than the fixture type testing apparatus.

APPARATUS FOR DETECTING DEFECTS OF WIRING BOARD

BACKGROUND OF THE INVENTION

1. Field of the Invention

The present invention relates to an apparatus for detecting defects such as disconnection, short-circuit and so on on a variety of wiring boards including printed wiring boards, liquid crystal display panels, packages for integrated circuits (IC packages), and so on.

2. Description of the Related Art

Conventionally, a variety of voltage detectors has been used to test for disconnection, short-circuit, and so on in a predetermined portion of an electric circuit or the like under measurement. This type of voltage detector detects a voltage at a predetermined position on an object under measurement by contacting a probe at the predetermined position.

However, taking printed wiring boards as an example, wiring densities on printed wiring boards have been rapidly increased particularly at present. More specifically, wiring patterns have been made finer, pitches between wires have been narrowed, and an increasing number of layers have been laminated on printed wiring boards. While wires on a throughhole mounted device (THD) board are generally drawn at a pitch of 1.27 mm, a surface mounted device (SMD) board requires 0.3 mm pitch for wires drawn thereon, and a chip on board (COB) requires 0.1 mm pitch for wires drawn thereon. The trend of increasing the density of wires on printed wiring boards may result in increasing the occurrence of defects such as disconnect and short circuit of wires. Thus, a need exists for a more accurate and low cost wire testing method in a printed wiring board testing procedure. Generally, the defects such as disconnect and short-circuit occur more times as the number of wires increases, the wire width is reduced, and an increased number of layers are formed on the board. Therefore, conduction and insulation tests for printed wiring boards are indispensable steps in order to prevent beforehand possible troubles which could be found after electronic devices are mounted thereon.

Currently used printed wiring board testing apparatuses may be roughly classified into two: a contact type and a non-contact type. Contact type testing apparatuses may be again classified into two: a type which utilizes a fixture corresponding To a printed wiring board and a flying type which allows an operator to freely move several probe pins on a printed wiring board for electrical testing.

With a fixture type testing apparatus, a contact probe pin having a spring is applied with a pressure so that the probe pin is brought into contact with a ground on a printed wiring board. Then, a predetermined bias voltage is applied to detect a conduction situation between the ground and each probe pin, and detected results are compared with reference data or design data to test for defects of wires on the printed wiring board.

Since the fixture must be manufactured for each printed wiring board under test, the fixture type testing apparatus has the disadvantages that a higher cost is required for designing and manufacturing the fixture and the fixture Is not compatible. A further disadvantage inherent to the fixture type testing apparatus is that it cannot be used for testing printed wiring boards having a wiring pitch less than 0.5 mm due to a limited accuracy of the shape of the probe pins and a pin upholding mechanism.

The flying type testing apparatus, on the other hand, is capable of testing printed wiring boards having a wiring An additional disadvantage of the flying type testing apparatus is that the testing apparatus itself is quite expensive.

Non-contact type testing apparatuses include printed wiring board appearance testing apparatuses which conduct a test utilizing an Image of a printed wiring board under test. The printed wiring board appearance testing apparatuses may utilize a method of comparing an image of a printed wiring board under test with an image of a good sample, a feature extraction method for checking whether a pattern has been formed on a board in accordance with a predetermined design rule, a checking method for comparing an actual printed wiring board with CAD data, a peculiar point recognition method, any combination of these methods, and so on. These methods can locate narrower wires on a printed wiring board, but cannot locate short-circuited wires.

A voltage detector utilizing an electronic beam, which is one of non-contact type testing apparatuses, detects a voltage between wires or a voltage between a wire and a probe and tests a printed wiring board based on the detected voltage. Although this voltage testing apparatus can detect a voltage without contacting a probe with a board under testing, a portion under measurement of the board must be placed in and exposed to a vacuum condition. In addition, there is a fear that the portion under measurement be damaged by the electronic beam.

As liquid-crystal display panels are expected to be utilized in increasingly wider applications, larger display sizes, higher image qualities provided by finer-pitches, and so on have been highly demanded for the liquid-crystal display panels, so that researches have been actively advanced for such liquid-crystal displays which meet these requirements. Actually, small-size and medium-size liquid-crystal display panels have been manufactured and commercialized. For the active matrix type liquid-crystal display panel, active elements such as transistors functioning as switching elements, diodes and so on must be formed for all pixels constituting a liquid-crystal display panel. Although the manufacturing process for the formation of these active elements is extremely complicated, the current situation has been advanced to such an extent that active matrix type liquid-crystal display panels having more than one million pixels have been sold in the market. For the active matrix type liquid-crystal display panels having increasing numbers of pixels, a reduced cost for the manufacturing process and increased yield rate by improving the process are highly demanded.

For reducing the cost for manufacturing the liquid-crystal display panels, it is of particular importance that defective liquid-crystal display panels be found as early as possible. Currently, liquid-crystal display panels are subjected to testing after liquid-crystal cells have been formed. Thus, if a defect is found in a liquid-crystal display panel, the defective liquid-crystal display panel is scrapped together with implanted liquid crystals. Particularly, in the case of color displays, a defective liquid-crystal display panel is scrapped together with a color filter inserted therein, so that such defective liquid-crystal display panels cause an increase in the manufacturing cost. In this sense, it is extremely advantageous to perform a test on panels before liquid-crystals are implanted therein in order to reduce the manufacturing cost.

Conventionally, an electrical measuring method and an optical measuring method have been employed for testing liquid-crystal display panels. The electrical measuring method may be a voltage measurement test using probe pins. For example, there is an apparatus which relies on a resistance measurement to conduct a test for disconnect and short-circuit between respective gate lines, drain lines, and Cs bus lines by contacting the probe pins on external connection pads or measuring pads of a thin-film transistor (TFT) array in an active-matrix type liquid-crystal display panel. However, with such an electrical measurement, it is absolutely impossible to conduct a test for disconnect and short-circuit for all pixels on an active matrix type liquid-crystal display panel having more than one million pixels. If all pixels were tested, the test would take an extremely long time.

An example of the optical measuring method may be a liquid-crystal display panel visual sensing test which may be performed after liquid-crystals are inserted between pixel electrodes and opposite electrodes of an active matrix type liquid-crystal display panel to form cells. This measuring method involves irradiating the surface of a liquid-crystal display panel under measurement with light, utilizing a two-dimensional CCD sensor to read an image of the panel in place of human's eyes, sequentially comparing adjacent periodical patterns using pattern recognition and image processing techniques, and detecting differences between these patterns as defects. Since the optical measuring method is based on a test for the appearance of a panel, it can recognize not only dust particles and foreign substances possibly attached on the panel but also defective patterns. However, the optical measuring method is not capable of accurately detecting electrical disconnect and short-circuit of wires.

In addition to the foregoing measuring methods, a voltage detector utilizing an electron beam, a measuring system utilizing a secondary electron amount generated by a surface potential and irradiation of an electron beam, have been practically used as non-contact type testing apparatuses for liquid-crystal display panels. However, a liquid-crystal display panel under measurement need be placed in a vacuum condition, and a portion subjected to the test must be exposed thereto. Moreover, there is a fear that the liquid-crystal display panel may be damaged by the electron beam.

Japanese Patent Laid-open Nos. 5-240800 and 5-256794 each describe a testing apparatus for liquid-crystal display boards utilizing an electro-optical material or a polymer distributed liquid-crystal sheet. The testing apparatus utilizing the electro-optical material takes advantage of a property of the electro-optical material that its double refractive index is changed by an electric field from a liquid crystal display panel. Specifically, when the electro-optical material placed in an electric field is irradiated with a laser beam, a polarization condition of the irradiated laser beam, i.e., a phase difference between vibration components in orthogonal two directions varies depending upon the magnitude of the electric field. Generally, this variation in polarization condition can be transduced into a change in electrical magnitude by transmitting polarized light through a polarizing plate which has a polarization direction set to a certain proper axial direction, so that the presence or absence of defects in a liquid-crystal display panel can be tested by observing the electrical magnitude at a certain position. However, in general, presently available electro-optical materials are mainly inorganic crystals such as $LiNbO_3$ or the like. These inorganic crystals generally have dielectric coefficients larger than the dielectric coefficient of a space between a portion of a liquid-crystal display panel under measurement and the inorganic crystal, i.e., the dielectric coefficient of a layer of air, so that an electric field applied to the inorganic crystal is reduced, thus causing a degraded measurement sensitivity. Further, in general, an electro-optical material having a large area cannot be actually fabricated even if either an inorganic crystal or an organic crystal is used.

A polymer distributed liquid-crystal sheet is positioned above a liquid-crystal display panel in a state where it is enclosed in a transparent case. However, with such a liquid-crystal sheet, a response speed of a testing apparatus, which depends on a response speed of liquid-crystal molecules with respect to an electric field, is in the order of milliseconds, so that even if fast testing is conducted, a testing time cannot be largely reduced.

Further, when an integrated circuit having a multiplicity of terminals such as LSI is mounted on a printed circuit board or the like, a conversion connector is required to extend spacings between respective adjacent terminals. Since recent high-speed clock integrated circuits generate a significant amount of heat, many of them are enclosed in a ceramics package which exhibits a good heat dissipation. Even integrated circuits which do not need to dissipate so much heat are also enclosed in cheap plastic packages. These packages for integrated circuits also tend to have increasingly narrowing terminal pitches. While 0.3 mm pitch is currently being used, 0.1 mm pitch is also under consideration.

For testing a conventional package for integrated circuit (IC packages) having 0.3 mm pitch, a dedicated fixture or a flying type prober has been used. However, the dedicated fixture must have an arrangement of pins corresponding to the arrangement of electrodes and the number of electrodes of a particular package, so that it lacks the versatility. In addition, since a large number of expensive fine pins must be used, an increased cost is inevitable. Further, it is technically difficult to manufacture and arrange pins corresponding to a fine pitch configuration having, for example, 0.1 mm pitch. The flying type prober, on the other hand, differs from the fixture type one and utilizes several needle-like probes. Thus, while the testing apparatus itself is expensive, the probes, which are expendable supplies, are cheap. Nevertheless, it is difficult to precisely move the probes and contact them onto small electrodes. For this purpose, various techniques are required to accomplish this operation. Also, since several probes must be brought into contact with electrodes, the test requires a long time. Further, while the probes are formed in a fine needle shape and plated with gold on the surfaces thereof so as to be adapted to fine electrodes, it is inevitable that gold plated on electrodes be damaged by the probes during a test. As will be understood from the foregoing, the testing method using mechanical contact has certain limitations. It is therefore difficult to manufacture a fixture and pin probes corresponding to packages generally having terminals arranged at pitches of 0.1 mm or less and to make measurements on fine-pitch packages using such fixture and pin probes.

SUMMARY OF THE INVENTION

The present invention has been made in view of the problems as mentioned above. It is therefore an object of the present invention to provide a testing apparatus for detecting defective wires on a wiring board, which is capable of dealing with wires drawn at narrower intervals, and of detecting conductive conditions of wires as well as locating short-circuited wires.

It is another object of the present invention to provide a detector for detecting defective wires on a printed wiring board.

It is a further object of the present invention to provide a testing apparatus which is capable of dealing with small pixel areas and of detecting disconnect, short-circuiting condition and so on for transparent electrodes of a liquid-crystal display panel at a high detection accuracy and without damaging the liquid-crystal panel.

It is a still further object of the present invention to provide a testing apparatus for detecting defective wires which is capable of dealing with IC packages having terminals arranged at narrower pitches.

To achieve the above objects, the present invention provides a detector for detecting defective wires on a printed wiring board comprising at least one wiring layer, which is capable of detecting such defective wires by a combination of light emission and absence of light emission by a light emitting element substrate positioned in contact with the printed wiring board.

The detector comprises a light emitting element substrate including an organic light emitting element arranged on a transparent substrate and placed to be in contact with wires on the wiring board to be measured, the light emitting element substrate selectively emitting light in accordance with the presence and absence of a defect of the wires, and detecting means for detecting light emitted from the light emitting substrate, and is characterized by detecting the presence or absence of a defect of the wires by an output of the detecting means.

In one embodiment of the detector, the organic light emitting element preferably has one of the following structures:

(1) a structure having a light emitting layer sandwiched between an anode and a cathode;

(2) a structure having an anode, a hole transporting layer, a light emitting layer and a cathode laminated in this order;

(3) a structure having an anode, a light emitting layer, an electron transporting layer and a cathode laminated in this order; and (4) a structure having an anode, a hole transporting layer, a light emitting layer, an electron transporting layer and a cathode laminated in this order.

In another particularly preferred embodiment of the detector according to the present invention, the light emitting element substrate includes an organic light emitting diode having a structure formed of an anode, an organic PN-junction and a cathode laminated in this order. The organic light emitting diode is configured to emit light in response to an electric field applied between the anode and the cathode to have a current flow therethrough.

In this embodiment, the organic PN-junction is composed of an organic P-type fluorescent semiconductor thin film and an organic N-type fluorescent semiconductor thin film, both of the films having fluorescence. The organic P-type fluorescent semiconductor thin film has one surface in contact with the anode and the other surface in contact with the organic N-type fluorescent semiconductor thin film, respectively, and the organic N-type fluorescent semiconductor thin film has one surface in contact with the cathode and the other surface in contact with the organic P-type fluorescent semiconductor thin film, respectively. The thickness of the organic PN junction may be in a range from 1 nm to 500 nm.

Preferably, the organic P-type fluorescent semiconductor thin film and the organic N-type fluorescent semiconductor thin film satisfy all of the following three conditions:

$X1 \leq X2$ $IP1 \leq IP2$ $-0.2\ eV \leq (IP2-IP1)-(X2-X1) \leq 0.2\ eV$ where X1 is an absolute value of electron affinity of the organic P-type fluorescent semiconductor thin film, X2 is an absolute value of electron affinity of the organic N-type fluorescent semiconductor thin film, IP1 is an absolute value of ionization potential of the organic P-type fluorescent semiconductor thin film, and IP2 is an absolute value of ionization potential of the organic N-type fluorescent semiconductor thin film.

The organic P-type fluorescent semiconductor thin film and the organic N-type fluorescent semiconductor thin film each may have a band gap from 1 eV to 3.5 eV.

The organic P-type fluorescent semiconductor thin film is preferably made of polyallylene vinylene polymer expressed by:

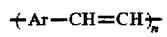

wherein Ar is a substituted or non-substituted bivalent aromatic hydrocarbon radical or a substituted or non-substituted bivalent hetero cyclic radical, these aromatic hydrocarbon radical and hetero cyclic radical may be condensed rings, and n is an integer equal to or more than 1. The organic N-type fluorescent semiconductor thin film is preferably made of aluminum tris(quinolinate).

In the foregoing two embodiments:

(1) the anode is preferably made of any of nickel, gold, platinum, palladium, selenium, indium, an alloy made of any combination of arbitrary elements including from nickel to indium, tin oxide, ITO, copper iodide, poly(3-methylthiophene), polyphenylene sulfide and polyaniline;

(2) the cathode is preferably made of any of silver, lead, tin, magnesium, aluminum, calcium, indium, chromium, lithium, and an alloy made of any combination of arbitrary elements including from silver to lithium;

(3) the light emitting element substrate preferably has a dimension substantially equal to the dimension of the wiring board.

(4) The defect of wires refers to at least one of disconnect of any of the wires and short-circuit between the wires.

(5) The wiring board is applied with a DC voltage.

(6) The wiring board is either a printed wiring board, a liquid-crystal display panel, or a package for integrated circuit.

DETAILED DESCRIPTION OF THE PREFERRED EMBODIMENTS

The present invention will hereinafter be described in connection with its preferred embodiments with reference to the accompanying drawings. It should be first noted, however, that the present invention is not limited to these specific embodiments.

Figure 1:
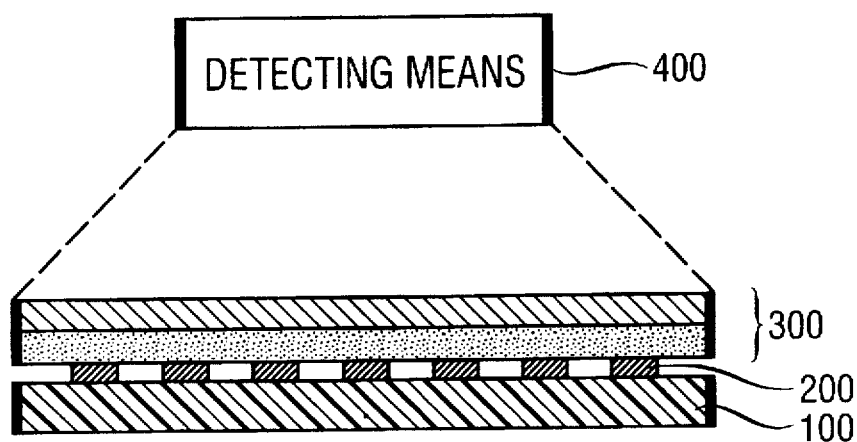
FIG. 1 is a conceptual diagram schematically illustrating the configuration of a detector according to the present invention.

FIG. 1 is a conceptual diagram schematically illustrating the configuration of a detector according to the present invention. Referring specifically to FIG. 1, the detector comprises a light emitting element substrate 300 in contact with wires 200 on a wiring board 100 which is subjected to a test for determining whether defects such as short-circuit, disconnect or the like of the wires exist. The light emitting element substrate 300 comprises a transparent substrate and a light emitting element formed on the transparent substrate. The light emitting element substrate 300 emits light or does not emit light in response to detection of a defect of the wires 200. Thus, whether light is emitted or not is detected by a detecting means 400, and processed to detect the presence or absence of a defect of the wires 200.

The light emitting element substrate 300 is positioned in contact with the wires 200 under measurement on the wiring board 100. Application of a voltage to the wires 200 under measurement causes the light emitting element substrate 300 to emit light or stop emitting light in response to a defect of the wires 200 under measurement. Then, the detecting means 400 senses whether light is emitted or not from the light emitting element substrate 300, for example, as an image, and determines whether or not a defect exists on the wires 200 under measurement based on the image sensed.

In a first embodiment of the present invention, the light emitting element is an organic light emitting element, and the detecting means 400 includes a detection unit and a signal processing unit. Light emitted from the organic light emitting element Is detected by the detection unit as an image, and the signal processing unit processes the image delivered from the detection unit to output a signal corresponding to the presence or absence of a defect of the wires.

Figure 2:
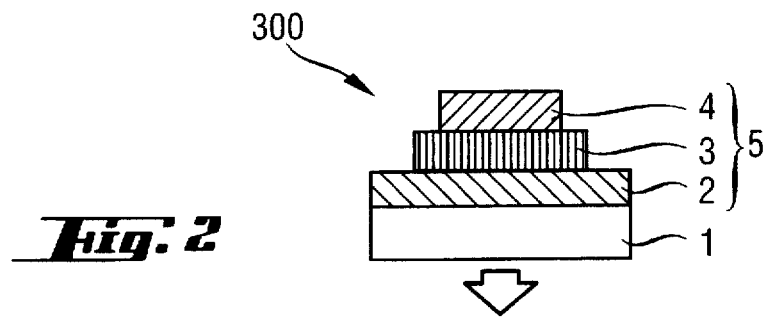
FIG. 2 is a diagram illustrating the configuration of a first example of a light emitting element substrate used in a first embodiment of the detector according to the present invention.

FIG. 2 illustrates an exemplary structure of the light emitting element board 300. Referring specifically to FIG. 2, the light emitting element substrate 300 has a lamination structure in which an anode 2, a light emitting layer 3 and a cathode 4 are laminated in this order on a transparent substrate 1. The anode 2, light emitting layer 3 and cathode 4 form an organic light emitting element 5. As an electric field is applied between the anode 2 and the cathode 4 to have a current pass therethrough, the light emitting layer 3 emits light.

The transparent substrate 1 must be transparent in a range of wavelength of the light which the light emitting element substrate 300 emits. The transparent substrate 1 may be made of, for example, any material belonging to a glass group such as soda glass, quartz glass, pyrex glass or the like, and optical plastics. Although the thickness of the transparent substrate 1 is not particularly limited, the thickness is preferably in a range from 10 mm to 0.1 mm. Also preferably, the transparent substrate 1 exhibits a good flatness.

A material suitable for the anode 2 deposited on the transparent substrate 1 is preferably a material having a large work function, for example, nickel, gold, platinum, palladium, selenium, indium, alloy made of any combination of these elements including from nickel to Indium, tin oxide, ITO (indium tin oxide), or copper iodide. In addition, a conductive polymer material such as poly(3-methylthiophen), polyphenylenesulfide, polyaniline or the like may be used for the anode 2. The anode 2 must be transparent in a range of wavelengths of light emitted from the light emitting element substrate 300, and is preferably made of an inorganic conductive material such as ITO, $SnO_2$ or the like. Alternatively, a commercially available Nesa Glass (registered Trade Mark) or the like may be used. Preferably, the transparent anode 2 has a resistance value equal to or less than 100 $\Omega cm^2$.

A large number of investigations have been made on materials suitable for the light emitting layer 3, and any of such light emitting materials may be used in the present invention. Compounds which can serve as the light emitting materials are listed below.

Single aromatic cyclic compounds including:

(1) conventionally known anthracene, pyrene, and benzo-condensed ring compounds expressed by the following structural formula (1) (see Japanese Patent Laid-open No. 4-17294):

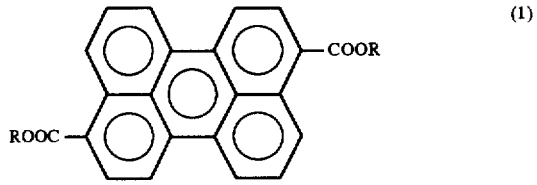

(2) a cumarin compound expressed by the following structural formula (2) (see Japanese Patent Laid-open No. 3-792);

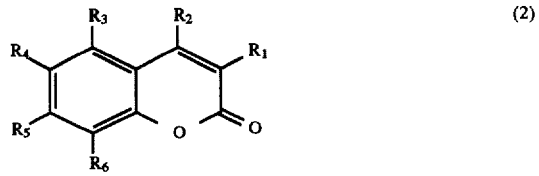

(3) a quinolone compound expressed by the following structural formula (3) (see Japanese Patent Laid-open No. 3-162483):

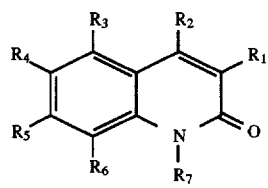

and (4) pyridoimidazoquinoxaline expressed, for example, by the following structural formula (4) (see Japanese Patent Laid-open No. 4-110390):

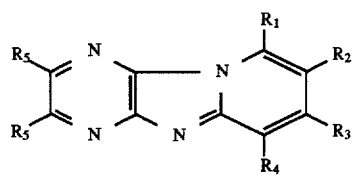

Also, the following compounds belonging to a group of condensed ring aromatic compounds may be used:

(1) a compound having the following structural formula (5) as shown in Japanese Patent Laid-open Nos. 5-179237 and 2-88689;

(2) condensed pyridine cyclic compounds such as that expressed by the following structural formula (6) (see Japanese Patent Laid-open No. 4-161481):

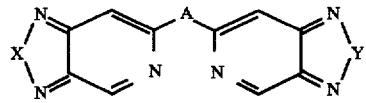

(3) a compound expressed by the following structural formula (7) (see Japanese Patent Laid-open No. 5-222362):

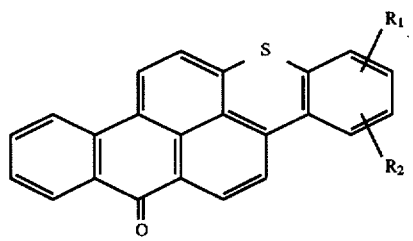

(4) a quinacridon compound and a quinazoline compound expressed, for example, by the following structural formula (8) (see Japanese Patent Laid-open No. 5-70773):

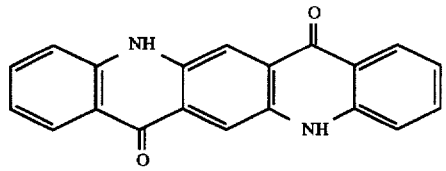

(5) a group of bis-oxazole compounds expressed by the following structural formula (9) which is described in Japanese Patent Laid-open No. 5-214335:

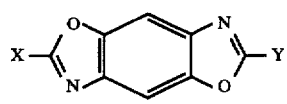

(6) a pyrrolopyrrole compound expressed by the following structural formula (10) (see Japanese Patent Laid-open No. 2-296891):

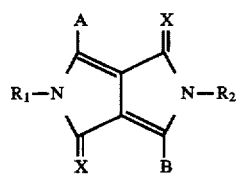

(7) a carboxyimide compound expressed, for example, by the following structural formula (11) (see Japanese Patent Laid-open No. 3-177487):

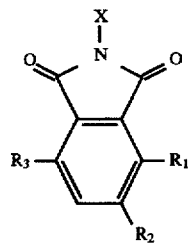

and (8) a group of carbazole diamine compounds expressed, for example, by the following structural formula (12) (see Japanese Patent Laid-open No. 3-35085):

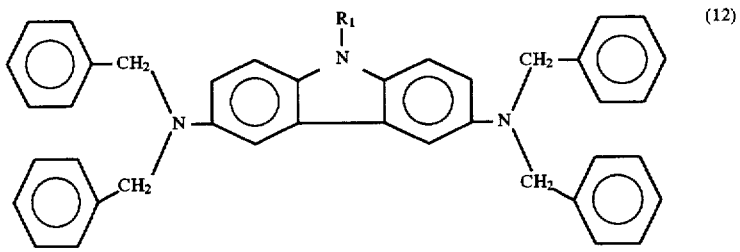

As conjugate dyes having a olefin double bond, compounds having the following structures may be used:

(1) a group of double-bonded aromatic compounds expressed, for example, by the following structural formula (13) (see Japanese Patent Laid-open No. 4-264189):

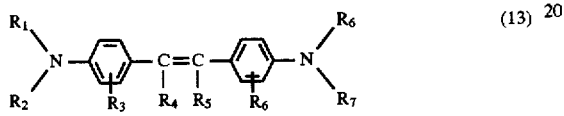

(2) a butadiene structure as expressed by the following structural formula (14) (see Japanese Patent Laid-open No. 4-88079):

and (3) a bivinyl aromatic structure as expressed by the following structural formula (15) (see Japanese Patent Laid-open No. 4-332787):

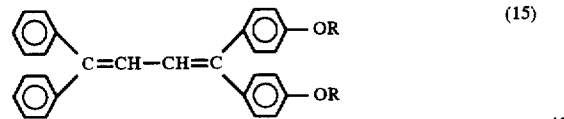

Further, the following compounds belonging to oligophenylene compounds and polyhetero cyclic compound groups may be used:

(1) an oligophenylene compound expressed by the following structural formula (16) (see Japanese Patent Laid-open No. 3-162484):

(2) an oxadiazole compound expressed by the following structural formula (17) (see Japanese Patent Laid-open No. 5-152072):

(3) a group of oxadiazole compounds expressed by the following structural formulae (18), (19) (see Japanese Patent Laid-open No. 4-93388):

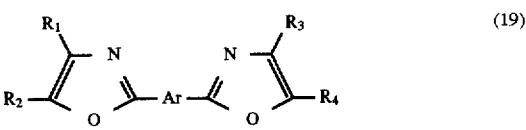

and (4) a group of bipyridine compounds expressed by the following structural formula (20) (see Japanese Patent Laid-open No. 3-287689):

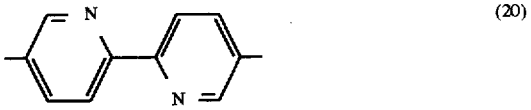

In addition, organic metal complex compounds as expressed by the following general formula (21) and described in Japanese Patent Laid-open Nos. 3-289089, 5-17764, 4-85388 may also be used as compounds of another form:

where M represents metal, and L a ligand.

In recent years, investigations have been advanced also on light emitting materials using polymers, and the following compounds may also be used as a light emitting layer in the first embodiment:

(1) a side-chain polymeric compound expressed, for example, by the following structural formula (22) (see Japanese Patent Laid-open No 4-77595):

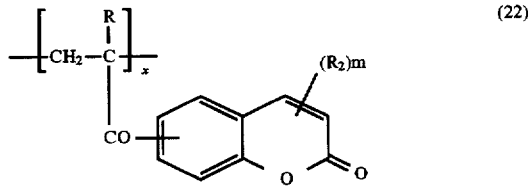

(2) a disjugate main-chain polymeric compound expressed, for example, by the following structural formula (23) (see Japanese Patent Laid-open No. 3-95291):

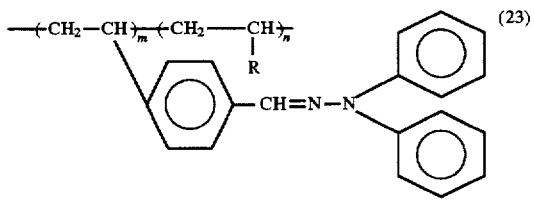

(3) a conjugate main-chain polymeric compound expressed, for example, by the following structural formula (24) (see Japanese Patent Laid-open No. 5-247460):

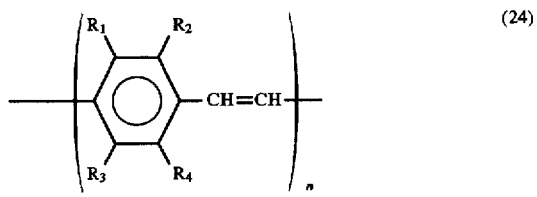

Further, there is a host material doped with a dye, for example, aluminum complex of 8-hydroxycumarin serving as a host material which is doped with a fluorescent dye for laser such as cumarin or the like (J. Appl. Phys., Vol. 65, p. 3610, 1989). Such doped compounds may also be used in the first embodiment.

A suitable material used for fabricating the cathode of the aforementioned organic light emitting element may be a metal having a small work function such as silver, lead, tin, magnesium, aluminum, calcium, indium, chrome, lithium or the like, or a alloy made of any combination of these elements including from silver to lithium.

Next, another example of the structure for the light emitting element substrate 300, which may be used in the first embodiment of the detector according to the present invention, will be described with reference FIGS. 3–5.

Figure 3:
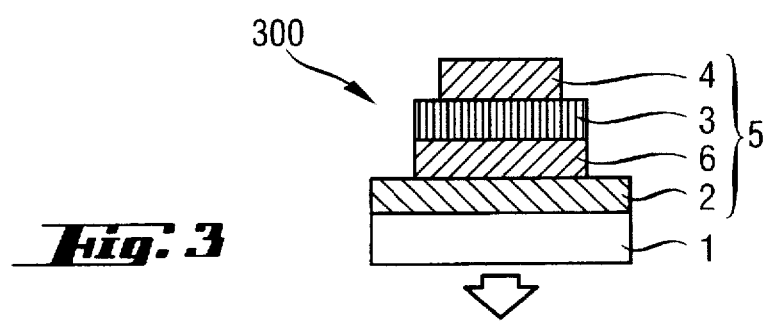
FIG. 3 is a diagram illustrating the configuration of a second example of a light emitting element substrate used in the first embodiment of the detector according to the present invention.

Referring first to FIG. 3, the light emitting element substrate 300 has a structure including a hole transporting layer 6 sandwiched between an anode 2 and a light emitting layer 3. While several types of materials are currently known for the hole transporting layer 6, the hole transporting layer 6 should be formed by a compound which is capable of efficiently transporting holes from the anode 2 toward the light emitting layer 3 when an electric field is applied between the anode 2 and a cathode 4. For this purpose, a material for the hole transporting layer 6 must have a small ionization potential and a large hole mobility as well as exhibit an excellent stability. Specifically, such material may be a diamine derivative which is aromatic amine. Other than the aromatic amine, a hydrazon compound may be used.

Figure 4:
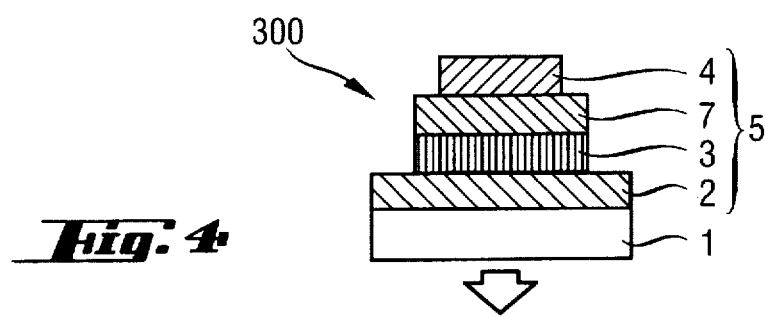
FIG. 4 is a diagram illustrating the configuration of a third example of a light emitting element substrate used in the first embodiment of the detector according to the present invention.

As illustrated in FIG. 4, an electron transporting layer 7 may be sandwiched between the light emitting layer 3 and the cathode 4. A material for the electron transporting layer 7 must be formed of a compound which is capable of efficiently transporting electrons from the cathode 4 toward the light emitting layer 3 when an electric field is applied between the anode 2 and the cathode 4. Therefore, the electron transporting layer 7 needs to be a compound which exhibits a high electron implant efficiency from the cathode 4 and is capable of efficiently transporting implanted electrons. For providing these properties, the compound must have a large electron affinity and a large electron mobility as well as exhibit an excellent stability. Compounds which satisfy these conditions may be aromatic compounds such as tetraphenylbutadiene (see Japanese Patent Laid-open No. 57-51781), metal complexes such as aluminum complex of 8-hydroxyquinoline (see Japanese Patent Laid-open No. 59-1943931 and cyclopentadiene derivative (see Japanese Patent Laid-open No. 2-289675).

Figure 5:
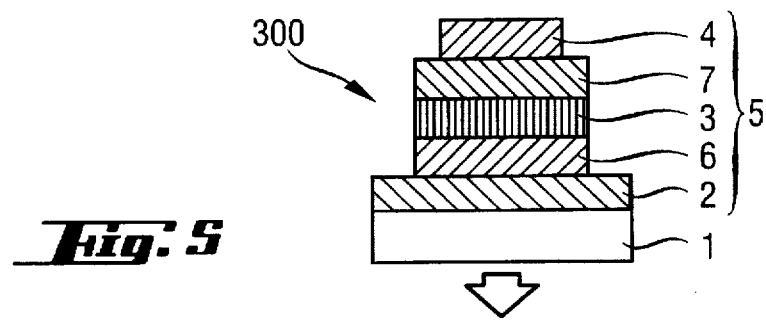
FIG. 5 is a diagram illustrating the configuration of a fourth example of a light emitting element substrate used in the first embodiment of the detector according to the present invention.

Further, as illustrated in FIG. 5, the light emitting element substrate 300 may be structured such that the hole transporting layer 6 is arranged between the anode 2 and the light emitting layer 3, and the electron transporting layer 7 is sandwiched between the light emitting layer 3 and the cathode 4. In this structure, the functions of the hole transporting layer 6 and the electron transporting layer 7 can be used in combination, so that more efficient light emission can be accomplished.

In a second embodiment of the present invention, the light emitting element is an organic light emitting diode, and the detecting means 400 includes a detector unit and a signal processing unit. The detector unit detects light emitted from the organic light emitting diode as an image, and the signal processing unit processes the Image delivered from the detector unit to output a signal corresponding to the presence or absence of a defect of the wires.

In the second embodiment, the organic light emitting diode formed on a transparent substrate comprises a structure having an anode, an organic PN-junction and a cathode laminated in this order, wherein an electric field is applied between the anode and the cathode to have a current flow therethrough, causing the organic PN-junction to emit light. The organic PN-junction is formed of an organic P-type fluorescent semiconductor thin film and an organic N-type fluorescent semiconductor thin film both having fluorescence. The organic P-type fluorescent semiconductor thin film has one surface in contact with the anode and the other surface in contact with the organic N-type fluorescent semiconductor thin film. The organic N-type fluorescent semiconductor thin film has one surface in contact with the cathode and the other surface in contact with the organic P-type fluorescent semiconductor thin film, respectively.

As described above, the organic PN-junction is fabricated by laminating P-type and N-type organic fluorescent semiconductor thin films having different band gaps. In a thermally saturated condition, the P-type region has the same Fermi level as the N-type region. The thermal saturation is achieved by carriers diffusing through the junction surface, and an internal electric field is generated in the PN-junction as a result. This internal electric field causes a vacuum level to move and a band end to be curved. An internal electric field generated in a conduction band between the P-type region and the N-type region functions as a potential barrier which prevents electrons from moving from the N-type region to the P-type region. Similarly, an internal electric field generated in a valence band between the P-type region and the N-type region functions as a potential barrier which prevents holes from moving from the P-type region to the N-type region. When a bias electric field is applied to the PN-junction in the forward direction, electrons are implanted from the cathode to the N-type region, while holes are implanted from the anode to the P-type region. The electrons and holes thus implanted are accumulated on the interface of the PN-junction. When the bias voltage exceeds a predetermined value, the electrons enter the P-type region of the PN-junction over the barrier formed by an internal potential and recombine with the holes to cause light emission. Also, when the bias voltage is equal to or higher than a predetermined value, the holes enter the N-type region over the barrier formed by an internal potential and recombine with the electrons to cause light emission.

The organic P-type fluorescent semiconductor thin film and the organic N-type fluorescent semiconductor thin film, forming the organic light emitting diode in the second embodiment; preferably have a band gap in a range from 1 eV to 3.5 eV, respectively. This is because a wavelength band including a visible light region from near infrared light (1240 nm) to ultraviolet light (354 nm) can be utilized so that the detection can be made easier.

Absolute values IP1, IP2 of ionization potentials of the organic P-type fluorescent semiconductor thin film and the organic N-type fluorescent semiconductor thin film forming the organic light emitting diode, and absolute values X1, X2 of their respective electron affinities satisfy the following three equations:

$$X1 \leq X2 \tag{1}$$

$$IP1 \leq IP2 \tag{2}$$

$$-0.2 \text{ eV} \leq (IP2-IP1)-(X2-X1) \leq 0.2 \text{ eV} \tag{3}$$

Preferably, a material for the transparent electrode serving as the anode of the organic light emitting diode has a small work function. For example, a polymer material having a structure expressed by the following general formula can be used:

wherein Ar represents substituted or non-substituted bivalent aromatic hydrocarbon radicals or substituted or non-substituted bivalent hetero cyclic radicals. These aromatic hydrocarbon radicals and hetero cyclic radicals may be condensed rings, and n in the formula is an integer equal to or more than 1.

Polymer materials as mentioned above are preferably conductive polymer materials of a poly(3-methylthiophene) group, a polyphenylene sulfide group, or a polyanilene group. In addition, fluorescent dye, a polymer material having fluorescent dye dispersed therein, or a fluorescent polymer material may also be used. An organic P-type fluorescent semiconductor thin film usable in the present invention has a structure expressed, for example, by

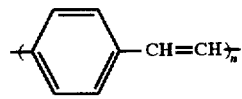

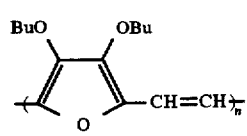

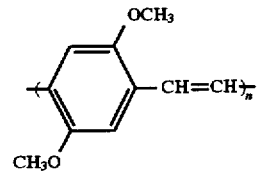

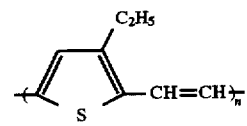

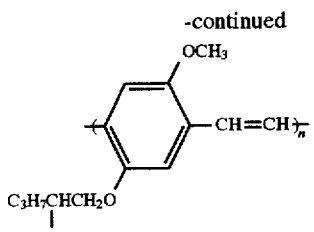

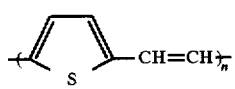

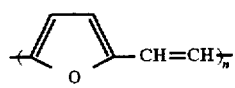

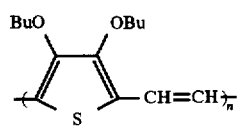

wherein n is an integer equal to or more than two; or

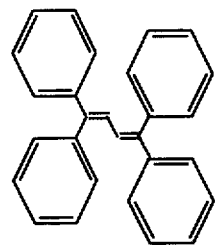

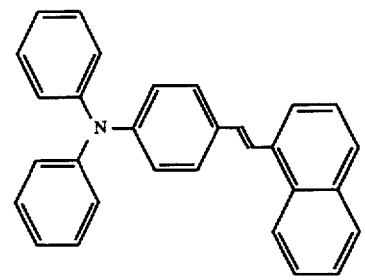

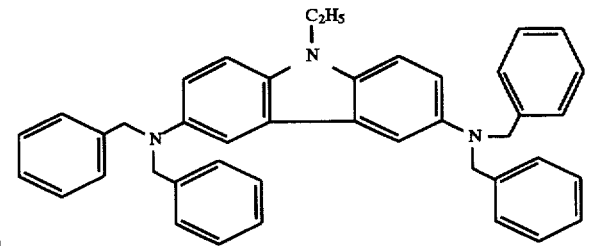

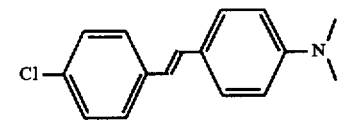

-continued

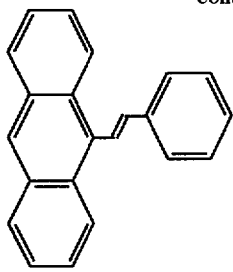

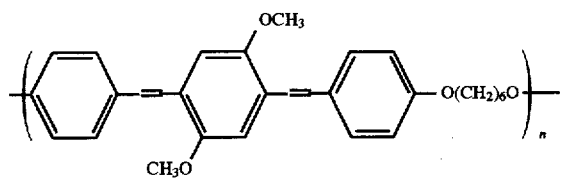

where n is an integer equal to or more than 2.

Specifically, the organic P-type fluorescent semiconductor thin film is more preferably made of polyallylene vinylene polymer, expressed by the following formula, which can be easily formed into a thin film by a method such as spin-coating and is thermally stable:

wherein Ar represents a substituted or non-substituted bivalent aromatic hydrocarbon radical or a substituted or non-substituted bivalent hetero cyclic radical. These aromatic hydrocarbon radical and hetero cyclic radical may be condensed rings, and n in the formula is an integer equal to or more than 2 and is preferably in a range from 5–30,000.

The polyallylene vinylene polymer can be synthesized by any known method.

Such a synthesizing method is described, for example, in:

(1) U.S. Pat. No. 3,706,677 issued to R. A. Wessling and R. G. Zimmerman;

(2) I. Murase et al. Synth. Net., 17,639 (1987);

(3) S. Antoun et al. J. Polym. Sci., Polym. Lett. Ed., 24,504 (1986);

(4) I. Murase et al. Polym. Commun., 1205 (1989);

(5) Japanese Patent Laid-open No. 1-79217; and (6) Japanese Patent Laid-open No. 1-254734.

The polyallylene vinylene polymers are divided into a solvent soluble type and a solvent insoluble type. A solvent soluble polyallylene vinylene polymer is dissolved in an organic solvent after synthesis and refinement, and a thin film of the solution is formed on a substrate, for example, by spin-coating. For a solvent insoluble polyallylene vinylene polymer, a solution of an equivalent solvent soluble chemical intermediate polymer is used to fabricate a thin film by a film forming method such as spin-coating, and thermally eliminated in vacuum to be converted to a conjugate polymer.

An example of polyallylene vinylene polymer usable in the second embodiment of the present invention may be polyphenylene vinylene polymer (hereinafter abbreviated as "PPV") expressed by the following structural formula:

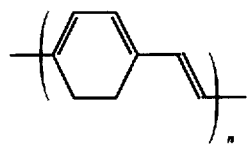

The organic N-type fluorescent semiconductor thin film used in the present invention may be formed of a fluorescent dye having an ionization potential and an electron affinity satisfying the foregoing equations (1)–(3), a fluorescent dye dispersed in a polymer material, or a fluorescent polymer material, together with the organic P-type fluorescent semiconductor thin film. For example, the organic N-type fluorescent semiconductor thin film may be formed of a material expressed by the following formula:

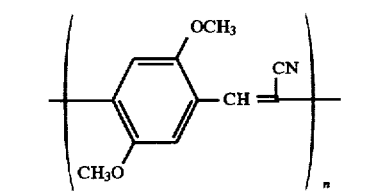

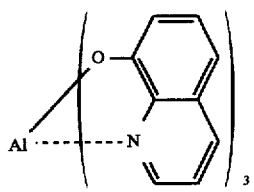

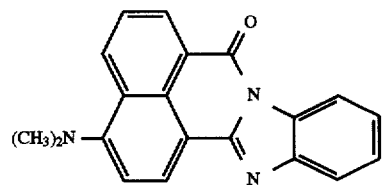

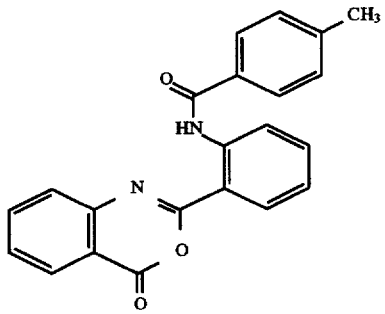

-continued
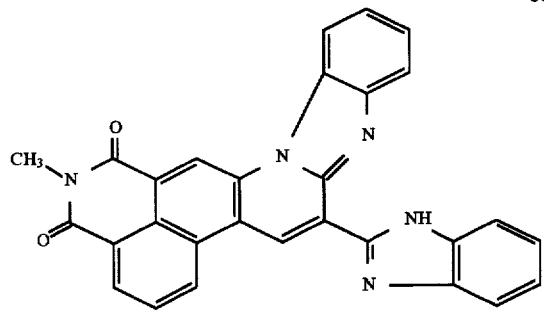
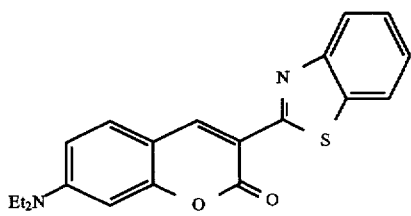
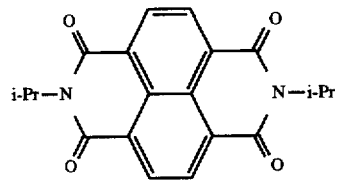
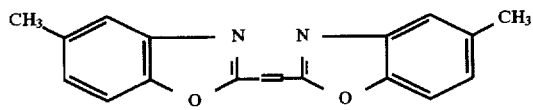
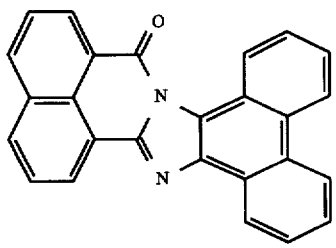
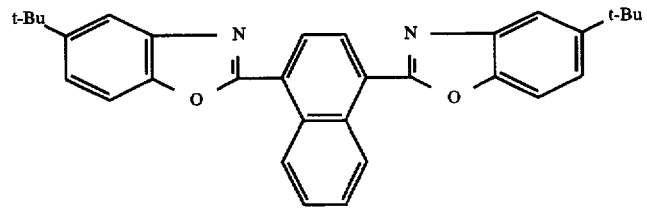
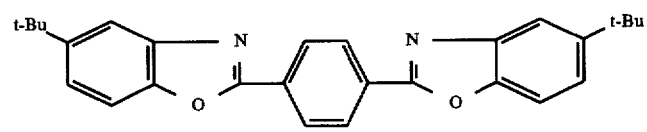
45
where n is an integer equal to or more than two; or a material expressed by the following formula:
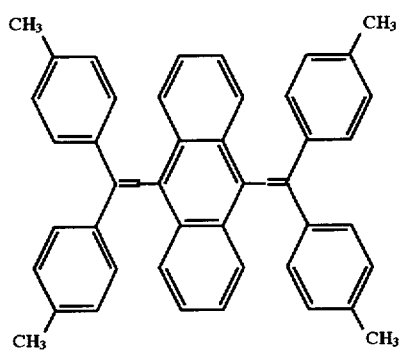
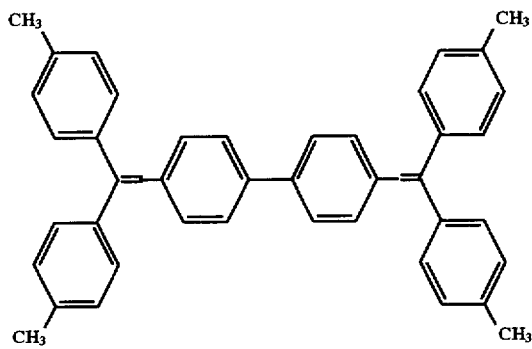

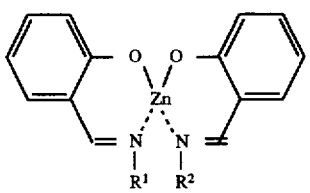
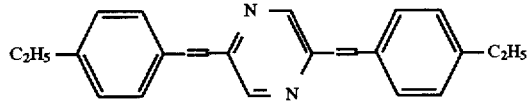
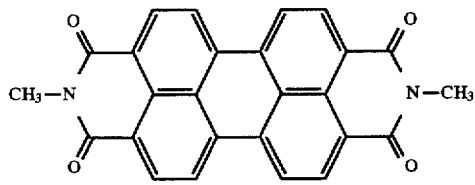
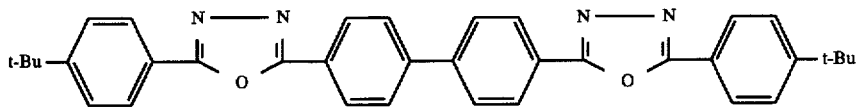

The organic P-type fluorescent semiconductor thin film and the N-type fluorescent semiconductor thin film, forming the organic PN-junction of the organic light emitting diode, may be fabricated by a known method, for example, vacuum deposition, spin-coating, sputtering, sol-gel, or the like. These organic fluorescent semiconductor thin films preferably have a thickness of 500 nm or less from a viewpoint of the transparency and for facilitating the manufacturing, and more preferably in a range from 10 nm to 200 nm. Thus, the organic PN-junction may have a thickness of 1000 nm or less, preferably in a range from 1 nm to 500 nm, and more preferably from 20 nm to 400 nm.

Since the organic light emitting diode in the second embodiment is fabricated as described above, an arbitrary size of the light emitting element substrate 300 can be provided. In addition, the light emitting element substrate can be mounted on a base which may be made of glass, quartz, metal sheet, or any other material commonly used for a base of an organic EL element.

In one embodiment of the detector according to the present invention, whether light is emitted or not from the organic light emitting diodes on the light emitting element substrate is input to the detecting means through an optical means such as a microscope. An example of the detecting means is a CCD camera. In this event, the light emitting element substrate, the optical means, and the detecting means may be integrally or separately formed. In an actual test, either of a wiring board, the optical means and the detecting means may be moved in a plane. Within a range of the resolution of the detecting means, the detection can be performed without moving any component. In the detector as described, a DC voltage ranging from 1 volt to 30 volts is applied between the anode of the organic light emitting diode and wires on a wiring board under test. If a wire on the wiring board under test is normal, the organic light emitting diode will generate light corresponding to the normal portion of the wire since the voltage is applied between the anode and the cathode of the organic light emitting diode. The detecting means captures a distribution of the light as image information which is displayed on a CRT or processed by a processing unit such as a computer, whereby a disconnected position and short-circuited position on the wires can be known from the relationship between the distribution of light emitting positions and the wires.

The detector according to the present invention may also be used to detect disconnection and short-circuit in simple matrix type and active matrix type liquid-crystal display panels. With a simple matrix type liquid-crystal display panel, the substrate is positioned at one end of a formed electrode and a voltage is applied from the other end. At a disconnected position or a portion exhibiting a high resistance, the light emitting element is not applied with the voltage, so that no light emitted from the organic light emitting element is observed, or the luminance of emitted light is lower than other portions. In this way, defects in a liquid-crystal display panel can be found. On the other hand, a short-circuited position can be also found by the same detector, utilizing the fact that light emission is observed at a position where light would not be emitted if short-circuit did not occur.

With an active matrix type liquid-crystal display panel, disconnected positions and short-circuited positions can be found based on whether light is emitted or not from an organic light emitting element when a voltage is applied between a signal electrode and a scan electrode. For example, if a disconnected wire exits, the voltage is not applied to a pixel electrode beyond the disconnected position so that no light emitted from an organic light emitting element corresponding to that position is observed.

The detector according to the present invention can also be used to detect defects of wires in packages for integrated circuits (IC packages) such as PGA, PPGA, BGA and PBGA. For this purpose, the light emitting element substrate is previously fixed so as to be in contact with wires, and the detecting means is moved to scan the wires. For detecting disconnected wires in an IC package, a voltage is applied to all wires in the IC package through an all-shorting bar or through a socket for applying a voltage to the wires. Next, the IC package is scanned by the detecting means to detect light emitted from an organic light emitting element thereby locating a disconnected wire. On the other hand, for detecting short-circuited wires in an IC package, a socket for applying a voltage is connected to pins of the IC package, and a voltage is applied to a single wire. If the wire applied with the voltage is short-circuited with another wire, light is emitted from an organic light emitting element corresponding to the short-circuited position. This procedure is sequentially repeated for all wires in the IC package, the presence or absence of short-circuited wires can be tested for all the wires. In this event, when the socket for applying a voltage is connected to a scanner, the application of a voltage to each wire can be automated.

Figure 6:
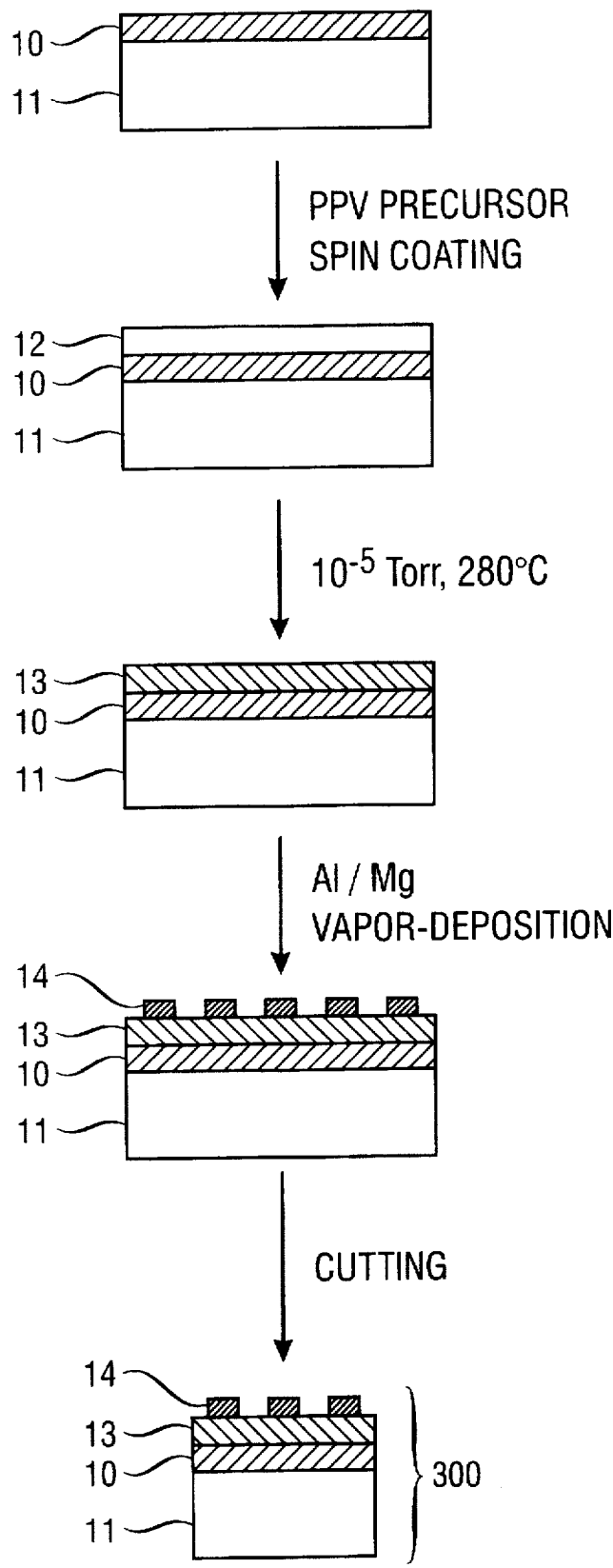
FIG. 6 is a diagram illustrating a manufacturing process of the light emitting element substrate shown in FIG. 2.
Figure 7:
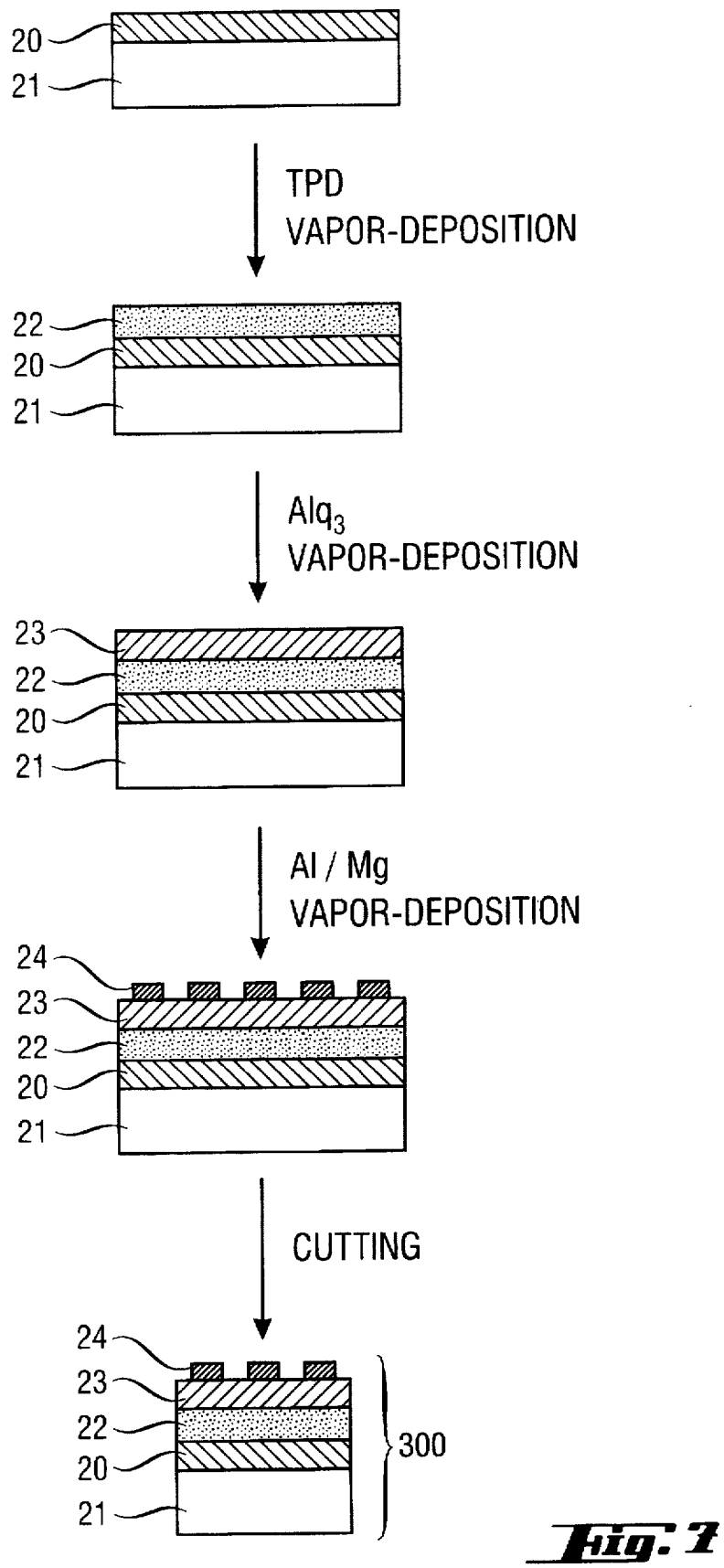
FIG. 7 is a diagram illustrating a manufacturing process of the light emitting element substrate shown in FIG. 3.
Figure 8:
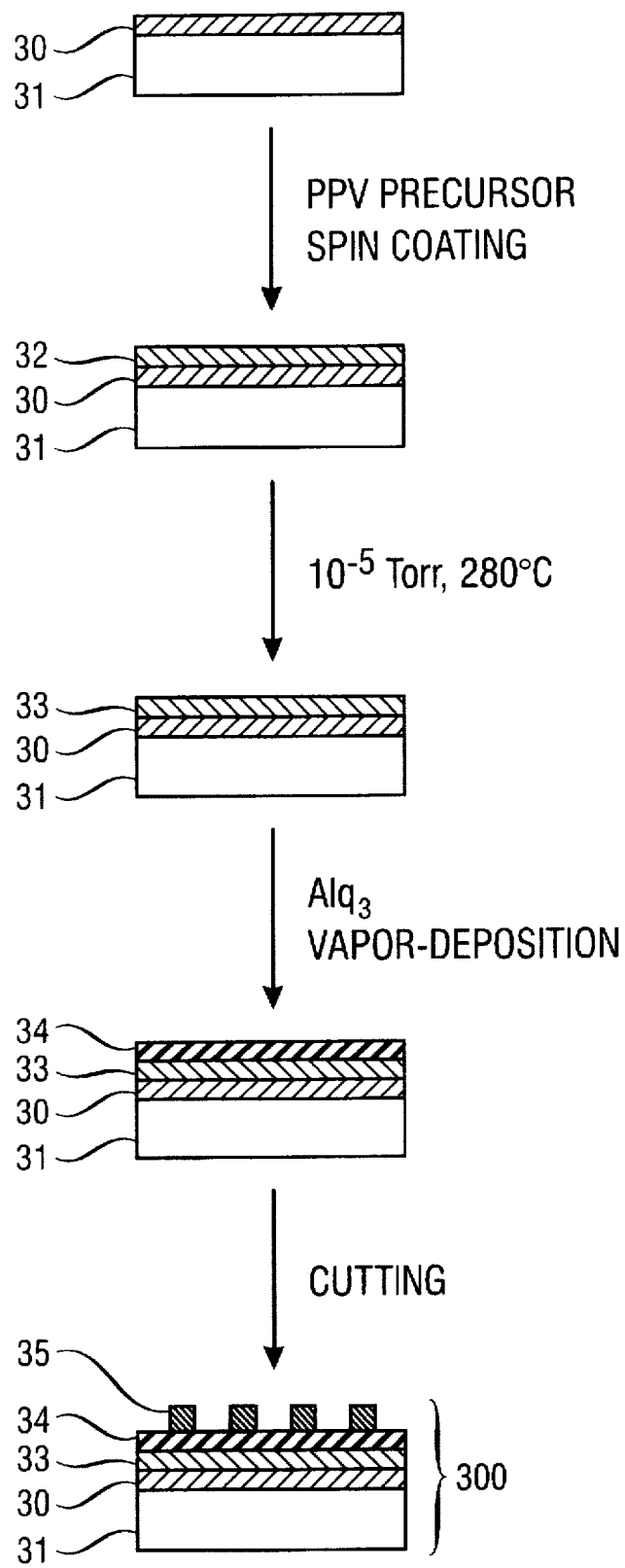
FIG. 8 is a diagram illustrating the structure of a light emitting element substrate used in a second embodiment of the detector according to the present invention.

Now, a process of fabricating the light emitting element substrate 300 used in the detector according to the present invention will be explained with reference to FIGS. 6–8. In FIGS. 6 and 7, an organic light emitting element is formed on a transparent substrate to fabricate the light emitting element substrate 300, while in FIG. 8, an organic light emitting diode is formed on a transparent substrate.

Referring specifically to FIG. 6, the light emitting element on the light emitting element substrate 300 has a lamination structure including an ITO layer (anode of a transparent electrode), a light emitting layer and an Al:Mg layer (cathode). First, a glass substrate 11 of 25 mm×7.5 mm×1.1 mm in size having an ITO layer of 120 nm in thickness used as a transparent electrode 10, is well cleansed, and polyphenylene vinylene polymer (PPV expressed by the following structural formula (25)) is fabricated on the transparent electrode 10 as a light emitting layer:

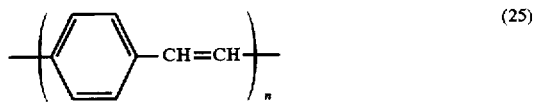
(25)

For the fabrication of the light emitting layer, 1 ml of a solvent made of 80 mg of a PPV precursor (expressed by the following structural formula (26)) and 10 ml of methanol is spin-coated on the transparent electrode 10 at a rotational speed of 2000 rpm for 100 seconds to form a thin film 12 of the PPV precursor:

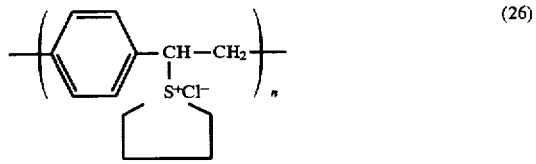
(26)

Then, the transparent substrate 10 with the PPV precursor thin film 12 formed thereon undergoes an elimination reaction in a vacuum oven at a pressure of $10^{-5}$ Torr and at a temperature of 280° C. to convert the thin film 12 to a PPV thin film 13 having a thickness of 30 nm. Subsequently, a metal deposition mask having a fine pattern is placed on the PVV thin film 13, and an alloy composed of 97% of Al and 3% of Mg is vapor-deposited on the PPV thin film 13 at a rate of 5 angstroms/sec to form a cathode 14 having a thickness of 150 nm. In this way, a chip having an organic light emitting element formed on the glass substrate 11 is fabricated. This chip is diced to have a desired size (for example, a rectangle chip of 15.6 mm×16.5 mm so as to conform with the size of PGA), thus completing the light emitting element substrate 300.

When the light emitting element substrate 300 thus fabricated was applied with a DC voltage of 10 volts between the transparent electrode 10 and the cathode 14, emission of yellow green light was observed. It can be confirmed from this observation that the light emitting element substrate 300 effectively functions as an organic light emitting element.

FIG. 7 illustrates a process of fabricating another light emitting element substrate 300. This light emitting element substrate 300 has a lamination structure including an ITO layer (anode), a hole transporting layer, a light emitting layer, and an Al:Mg layer (cathode).

First, similarly to the process illustrated in FIG. 6, a glass substrate 21 of 25 mm×7.5 mm×1.1 mm in size having an ITO layer of 120 nm in thickness, used as a transparent electrode 20, is well cleansed. Next, as the hole transporting layer, N, N'-diphenyl-N, N'-bis(3methylphenyl)-1, 1'-biphenyl-4, 4'-diamine, referred to as a triphenyl diamine derivative (hereinafter abbreviated as "TPO"), which is expressed by the following structural formula (27), is vapor-deposited on the glass substrate 21 at a vacuum of $5×10^5$ Torr to form a thin film 22 having a thickness of 50 nm:

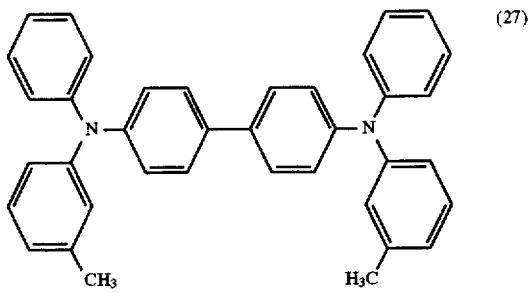
(27)

Next, as the light emitting layer, a thin film 23 made of tris(8-quinolinol) aluminum (hereinafter abbreviated as "Alq$_3$"), expressed by the following structural formula (28), is fabricated:

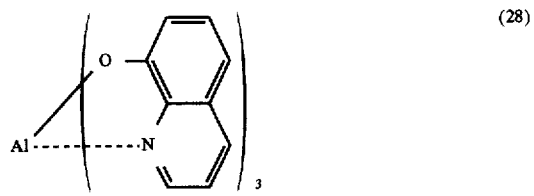
(28)

For the fabrication of the light emitting layer, Alq$_3$ is heated at a vacuum of $10^{-8}$ Torr, and vapor-deposited on the TPD thin film 22 in a thickness of 30 nm to form an Alq$_3$ thin film 23. Subsequently, similarly to the process of FIG. 6, a cathode 24 is vapor-deposited on the thin film 23 to fabricate a chip which is then cut in an appropriate size to complete the light emitting element substrate 300.

When the light emitting element substrate 300 thus fabricated was applied with a DC voltage of 5 volts between the transparent electrode 20 and the cathode 24, green light emitted from the substrate 300 was observed. It can be confirmed from this observation that the light emitting element substrate 300 effectively functions as an organic light emitting element.

Next, a process of fabricating the light emitting element substrate 300 used in the second embodiment of the detector according to the present invention will be explained with reference to FIG. 8. The light emitting element on the light emitting element substrate 300 illustrated in FIG. 8 is a hetero PN-junction organic light emitting diode having a lamination structure including an ITO layer (anode), a PPV layer, an Alq$_3$ layer and an Al:Mg layer.

First, a glass substrate 31 of 25 mm×7.5 mm×1.1 mm in size having an ITO layer of 120 nm in thickness, used as a transparent electrode 30, is well cleansed. Then, 1 ml of a solvent made of 80 mg of a PPV precursor and 10 ml of methanol is spin-coated on the transparent electrode 30 at a rotational speed of 2000 rpm for 100 seconds to form a thin film 32 of the PPV precursor. The transparent substrate 30 with the PPV precursor thin film 32 formed thereon undergoes an elimination reaction in a vacuum oven at a pressure of $10^{-5}$ Torr and at a temperature of 280° C. for four hours to convert the thin film 32 to a PPV thin film 33 having a thickness of 30 nm.

Next, Alq$_3$ is heated at a vacuum of $10^{-6}$ Torr, and vapor-deposited on the PPV thin film 33 in a thickness of 30 nm to form an Alq$_3$ thin film 34. Subsequently, a mask is placed on the Alq$_3$ thin film 34, and an alloy composed of 97% of Al and 3% of Mg is vapor-deposited on the Alq$_3$ thin film 34 at a rate of 5 angstroms/sec to form a cathode 35 having a thickness of approximately 150 nm. The chip thus fabricated is cut to have a size of 15.6 mm×16.5 mm so as to conform with, for example, the size of PGA, thus completing the light emitting element substrate 300.

When this light emitting element substrate 300 was applied with a DC voltage of 5 volts between the transparent electrode 30 and the cathode 35, a current of 0.4 mA/mm² flowed and emission of green-yellow light having a brightness of 240 cd/m² emitted from the substrate 300 was observed. The light emitting element substrate 300 exhibited a light emitting efficiency of 0.371 m/W, with a maximum brightness being 2600 cd/m² and a maximum absorption wavelength being at 545 nm.

Figure 9A:
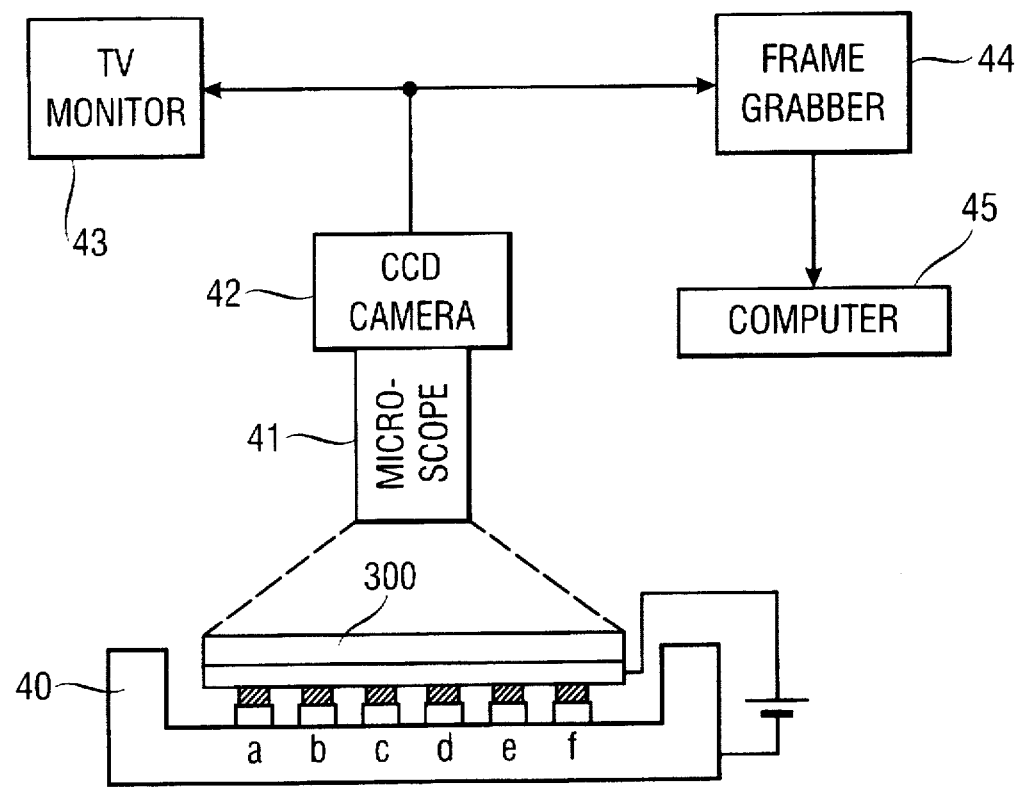
FIG. 9A is a diagram schematically illustrating the configuration of a first example of the detector according to the present invention.
Figure 9B:
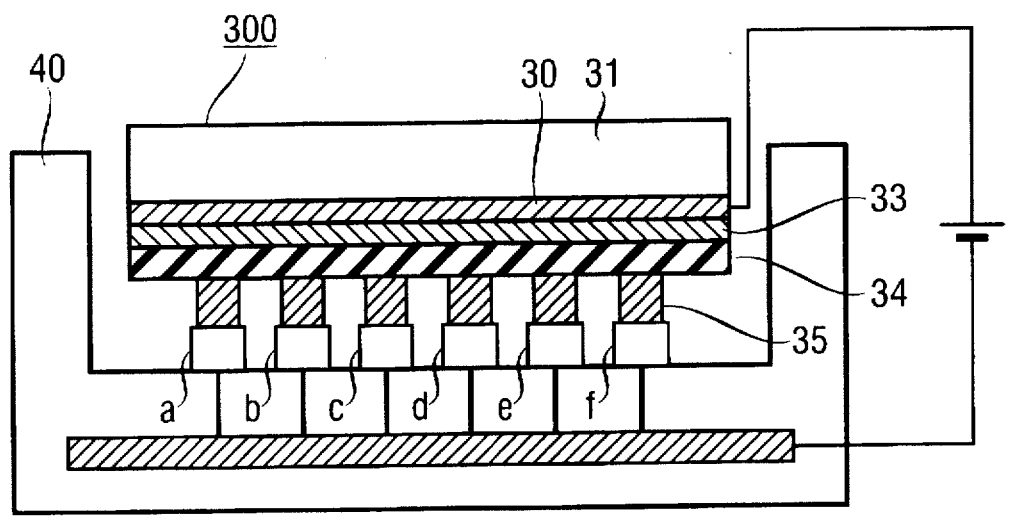
FIG. 9B shows a positional relationship between a light emitting element substrate of the detector and PGA.

Next, preferred examples of the detector according to the present invention will be described with reference to FIGS. 9A, 9B, 10A, 10B and 10C. FIGS. 9A and 9B are diagrams for illustrating a first example of the detector according to the present invention. Specifically, FIG. 9A illustrates the structure of the detector using the light emitting element substrate fabricated by the manufacturing process shown in FIG. 8 and a positional relationship between a PGA and the light emitting element substrate when the detector is used to test for defects of wires in a PGA which is one type of IC packages. FIG. 9B illustrates in an enlarged view the positional relationship between the light emitting element substrate and the PGA.

In FIGS. 9A and 9B, the light emitting element substrate 300 has substantially the same size as a PGA 40 under test, and a cathode 35 is positioned to be in contact with wires in the PGA 40. For detecting a light emitting pattern of the light emitting element substrate 300 when a voltage is applied between the transparent electrode 30 of the light emitting element substrate 300 and a shorting bar of the PGA, a CCD camera (detecting means) 42 is disposed above the light emitting element substrate 300 through a microscope (optical means) 41. The output of the CCD camera 42 is supplied to a television monitor 43 and a frame grabber 44, and the output of the frame grabber 44 is supplied to and processed by a computer 45. The microscope 41 and the CCD camera 42 may be provided in an Integrated form.

In the following, the operation of the detector illustrated in FIGS. 9A and 9B will be specifically explained in connection with an example in which a PGA 40 having wires a, b, c, d, e, f is to be tested, and a wire c is disconnected and the remaining wires a, b and d–f are normal.

As illustrated in FIGS. 9A and 9B, with the cathode 35 of the light emitting element substrate 300 placed in contact with the wires a–f, a DC voltage of 10 volts is applied between the transparent electrode 30 and the shorting bar of the PGA 40, where the transparent electrode 30 is positioned on the positive side. Portions of the light emitting element substrate 300 on the normal wires a, b, d–f emit light, whereas a portion of the light emitting element substrate 300 on the disconnected wire c does not emit light, This light emission distribution is captured as an image signal by the CCD camera 42 through the microscope 41 and displayed on the television monitor 43. Simultaneously, an image signal from the CCD camera 42 is sent at real time to the frame grabber 44 which divides the image signal by a resolution of 512×512 and in 256 gray levels of gradation, and sends the resulting pattern to the computer 45. The computer 45 analyzes the pattern on an on-line basis using image processing software. In this way, it can be confirmed that a condition of light emission from a portion corresponding to the wire c is different from conditions of light emission from portions corresponding to the other wires a, b, d–f, so that the wire c is determined to be defective.

Figure 10A:
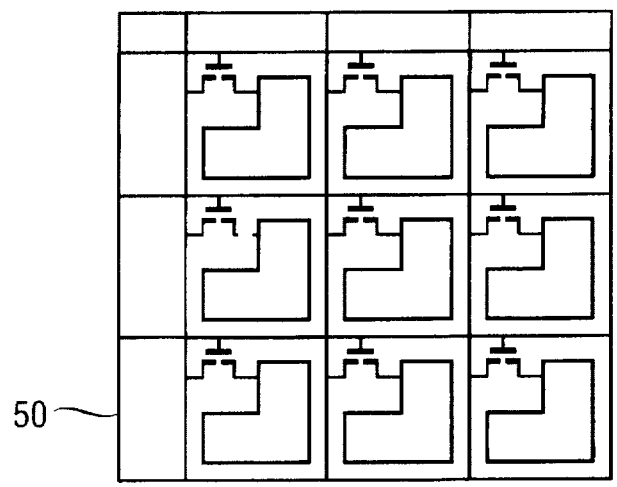
FIG. 10A is a diagram schematically illustrating the structure of a TFT active matrix type liquid-crystal display panel under test.
Figure 10B:
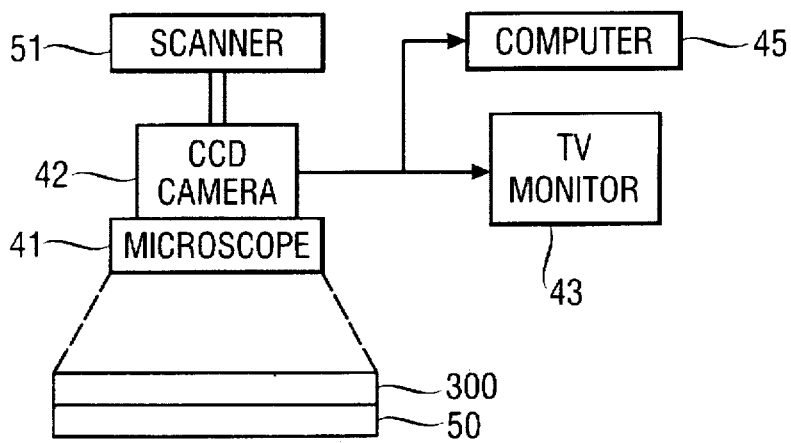
FIG. 10B is a diagram schematically illustrating the configuration of the second example of the detector according to the present invention for detecting defective wires on the liquid-crystal display panel.

FIGS. 10A and 10B are diagrams for explaining a second example of the detector according to the present invention. FIG. 10A schematically illustrates a pattern of TFT's, pixel electrodes, signal electrodes and scan electrodes formed on a TFT active matrix type liquid-crystal display panel 50 having an array of pixels arranged in three rows and three columns, which is to be tested by the detector using the light emitting element substrate 300 fabricated by the process illustrated in FIG. 8. It is assumed herein that a wire between a pixel electrode and a TFT is disconnected in a cell at second row and first column. FIG. 10B schematically illustrates the configuration of a detector for testing for defects of wires on the liquid-crystal display panel 50 by means of the light emitting element substrate 300. The light emitting element substrate 300 has an Alq₃ thin film and a cathode formed thereon which is fabricated in a size of 20 μm×20 μm corresponding to the pattern of the signal electrodes and the scan electrodes on the liquid-crystal display panel 50. Similarly to FIG. 9, the light emitting element substrate 300 has a size which covers substantially the entire surface of the liquid-crystal display panel 50.

Figure 10C:
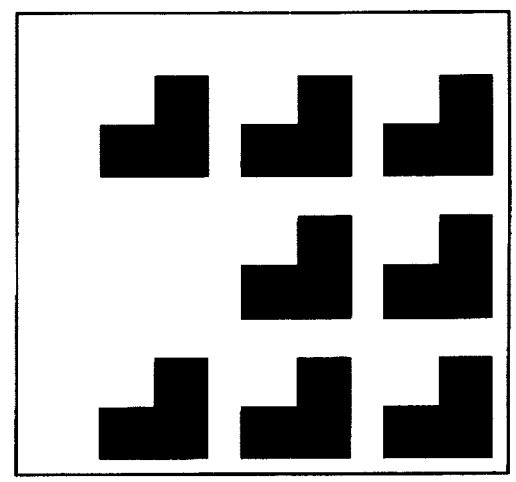
FIG. 10C is a diagram illustrating a light emitting pattern produced by the detector of FIG. 10B.

In FIG. 10, the light emitting element substrate 300 is registered to a reference point using, for example, a reference pin such that it is placed on the liquid-crystal display panel 50 corresponding to the electrode pattern on the liquid-crystal display panel 50. Next, when a voltage is applied between each of all signal electrodes and a corresponding scan electrode, portions of the light emitting element substrate 300 corresponding to pixel electrodes normally connected to TFT's emit light, whereas a portion of the light emitting element substrate 300, corresponding to the pixel electrode in a cell at the second row and first column, does not emit light since this pixel electrode is disconnected with its corresponding TFT. A light emission pattern of the light emitting element substrate 300 produced at this time is illustrated in FIG. 10C, wherein portions of the light emitting element substrate 300 corresponding to defect-free wires emit light. It should be noted that in FIG. 10C, light emitting portions are marked by black. This light emitting pattern is imaged by the CCD camera 42 through the microscope 41 to be displayed on the television monitor 43 and simultaneously processed by the computer 45. Alternatively, the microscope 41 and the CCD camera 42 may be moved in parallel with the light emitting substrate 300 by a scanner 51.

As will be apparent from the foregoing detailed description of the present invention, the present invention permits the fabrication of a light emitting element substrate corresponding to wires in a variety of shapes and small pixels under measurement, so that the presence or absence of defective wires can be accurately detected. Further, since the light emitting element substrate of the present invention promptly responds to a voltage applied thereto, the presence or absence of defective wires can be quickly detected. Further, since the light emitting element substrate of the present invention can be fabricated at a low cost, this light emitting element substrate may be combined with any existing detecting means to provide a detector at a low cost.

What is claimed is:

1. An apparatus for detecting defects of wires in a wiring board including at least one wiring layer, comprising:

a light emitting element substrate including an organic light emitting element arranged on a transparent substrate and placed to be in contact with wires on said wiring board to be measured, said light emitting element substrate selectively emitting light in accordance with the presence and absence of a defect of said wires; and detecting means for detecting light emitted from said light emitting element substrate to generate an output indicative of the presence of a defect of said wires.

2. An apparatus according to claim 1, wherein:

said light emitting element substrate includes an organic light emitting diode having a structure formed of an anode, an organic PN-junction and a cathode laminated in this order, said organic light emitting diode emitting light in response to an electric field applied between said anode and said cathode causing a current to flow therethrough;

said organic PN-junction is composed of an organic P-type fluorescent semiconductor thin film and an organic N-type fluorescent semiconductor thin film, both said films having fluorescence; and said organic P-type fluorescent semiconductor thin film has one surface in contact with said anode and the other surface in contact with said organic N-type fluorescent semiconductor thin film, respectively, and said organic N-type fluorescent semiconductor thin film has one surface in contact with said cathode and the other surface in contact with said organic P-type fluorescent semiconductor thin film, respectively.

3. An apparatus according to claim 2, wherein said organic PN-junction has a thickness ranging from 1 nm to 500 nm.

4. An apparatus according to claim 2, wherein:

said organic P-type fluorescent semiconductor thin film and said organic N-type fluorescent semiconductor thin film satisfy the following three conditions:

$$X1 \leq X2$$

$$IP1 \leq IP2$$

$$-0.2\ eV \leq (IP2-IP1)-(X2-X1) \leq 0.2\ eV$$

where X1 is an absolute value of electron affinity of said organic P-type fluorescent semiconductor thin film, X2 is an absolute value of electron affinity of said organic N-type fluorescent semiconductor thin film, IP1 is an absolute value of ionization potential of said organic P-type fluorescent semiconductor thin film, and IP2 is an absolute value of ionization potential of said organic N-type fluorescent semiconductor thin film.

5. An apparatus according to claim 2 wherein, said organic P-type fluorescent semiconductor thin film and said organic N-type fluorescent semiconductor thin film each have a band gap from 1 eV to 3.5 eV.

6. An apparatus according to claim 2, wherein said organic P-type fluorescent semiconductor thin film is made of polyallylene vinylene polymer expressed by:

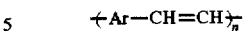

wherein Ar is a substituted or non-substituted bivalent aromatic hydrocarbon radical or a substituted or non-substituted bivalent hetero cyclic radical, these aromatic hydrocarbon radical and hetero cyclic radical may be condensed rings, and n is an integer equal to or more than 1.

7. An apparatus according to claim 2, wherein said organic N-type fluorescent semiconductor thin film is made of aluminum tris(quinolinate).

8. An apparatus according to claim 1, wherein:

said organic light emitting element has one of the following structures:
(1) a structure having a light emitting layer sandwiched between an anode and a cathode;
(2) a structure having an anode, a hole transporting layer, a light emitting layer and a cathode laminated in this order;
(3) a structure having an anode, a light emitting layer, an electron transporting layer and a cathode laminated in this order; and
(4) a structure having an anode, a hole transporting layer, a light emitting layer, an electron transporting layer and a cathode laminated in this order.

9. An apparatus according to claim 8, wherein: said anode is made of any of nickel, gold, platinum, palladium, selenium, indium, an alloy made of any combination of the elements including from nickel to indium, tin oxide, ITO, copper iodide, poly(3-methylthiophene), polyphenylene sulfide and polyaniline; and said cathode is made of any of silver, lead, tin, magnesium, aluminum, calcium, indium, chromium, lithium, and an alloy made of any combination of the elements including from silver to lithium.

10. An apparatus according to claim 8, wherein said light emitting element substrate has a dimension substantially equal to the dimension of said wiring board.

11. An apparatus according to claim 8, wherein said defect of wires is at least one of disconnect of any of said wires and short-circuit between said wires.

12. An apparatus according to claim 8, wherein a voltage applied to said wires is a DC voltage.

13. An apparatus according to claim 8, wherein said wiring board is a printed wiring board, a liquid-crystal display panel, or a package for integrated circuit.

* * * * *